(12) United States Patent
Stanion

(10) Patent No.: US 6,665,844 B1
(45) Date of Patent: Dec. 16, 2003

(54) CIRCUIT SYNTHESIS VERIFICATION METHOD AND APPARATUS

(75) Inventor: Robert T. Stanion, Lake Oswego, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/562,515

(22) Filed: May 1, 2000

Related U.S. Application Data

(63) Continuation of application No. 08/943,419, filed on Oct. 3, 1997, now Pat. No. 6,056,784.
(60) Provisional application No. 60/027,766, filed on Oct. 4, 1996.

(51) Int. Cl.$^7$ ................................................ G06F 17/50
(52) U.S. Cl. ............................................ 716/5; 703/15
(58) Field of Search ................................ 716/1, 2, 4, 5, 716/6, 3, 18; 703/13, 14, 15

(56) References Cited

U.S. PATENT DOCUMENTS

| | | | |
|---|---|---|---|
| 5,359,537 A | * | 10/1994 | Saucier et al. ................ 716/18 |
| 5,745,373 A | * | 4/1998 | Watai et al. ................... 716/12 |
| 5,805,462 A | * | 9/1998 | Poirot et al. .................. 716/18 |
| 5,892,687 A | * | 4/1999 | Moricz et al. ................ 716/18 |
| 6,056,784 A | * | 5/2000 | Stanion .......................... 716/5 |

OTHER PUBLICATIONS

Bergamaschi et al., "Efficient Use of Large Don't Cares in High–Level and Logic Synthesi," 1995 IEEE, pp. 272–278.*
Brand, "Verification of Large Synthesized Designs," 1993 IEEE pp. 534–537.*
Brand et al., "Be Careful with Don't Cares," 1995 IEEE, pp. 83–86.*
Bryant, "Graph–Based Algorithms for Boolean Function Manipulation," IEEE Trans. on Computers, vol. C–35, No. 8, Aug. 1986, pp. 677–691.*
Bryant, "On the Complexity of VLSI Implementations and Graph Representations of Boolean Functions with Application to Integer Multiplication," IEEE Trans. on Computers, vol. 40, No. 2, Feb. 1991, pp. 205–213.*
Cerny et al., "An Approach to Unified Methodology of Combinational Switching Circuits," IEEE Trans. on Computers, vol. C–26, No. 8, Aug. 1977, pp. 745–756.*
Damiani, "Nondeterministic finite–state machines and sequential don't cares," 1994 IEEE, pp. 192–198.*
Damiani et al., "Don't Care Set Specifications in Combinationa and Synchronous Logic Circuits," IEEE Trans. on CAD of ICs and Systems, col. 12, No. 3, Mar. 1993, pp. 365–388.*

(List continued on next page.)

*Primary Examiner*—Leigh M. Garbowski
(74) *Attorney, Agent, or Firm*—Bever, Hoffman & Harms, LLP; Jeanette S. Harms

(57) ABSTRACT

The invented method addresses two important issues concerning don't cares in formal system or circuit synthesis verification. First, it is shown how to represent explicit don't cares in linear space in a flattened hierarchy. Many circuits need this information for verification, but the classical calculation can be exponential. Second, three interpretations of verification on incompletely specified circuits are explored and it is shown how the invented method makes it easy to test each interpretation. The invented method involves transforming each cell within an original circuit that implements an incompletely specified function into set of plural cells that implement the upper and lower bound of the interval of the function. The method thus constructs networks for the endpoints of the intervals and, rather than constructing traditional miters, connects the outputs of the interval circuits with the logic appropriate for the property, e.g. equality or consistency, that is to be verified. The invented apparatus includes operatively coupled processors, e.g. hardware, software or firmware processors, that cooperate to implement the invented method.

14 Claims, 3 Drawing Sheets

OTHER PUBLICATIONS

Jain et al., "Advanced Verification Techniques Based on Learning," 32nd DAC 1995, pp. 420426.*

Kunz, "HANNIBAL: An Efficient Tool for Logic Verification Based on Recursive Learning," IEEE 1993, pp. 538–543.*

Mailhot et al., "Technology Mappng Using Boolean Matching and Don't Care Sets," IEEE 1990, pp. 212–216.*

Matsunaga, "An Efficient Equivalence Checker for Combinational Circuits," 33rd DAC 1996, pp. 629–634.*

Devades et al., "Redundancies and Don't Cares in Sequential Logic Synthesis," 1989 Int'l Test Conference, pp. 491–500.

Stoffel et al., "Logic Equivalence Checking by Optimization Techniques," 1996 Int'l Workshop on CAD, Test and Evaluation for Dependability, pp. 85–90.

Zemva et al., "A Functional Fault Model: Feasability and Applications," IEEE 1994, pp. 152–158.

* cited by examiner

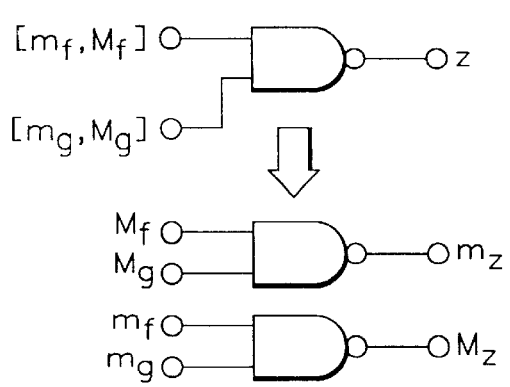
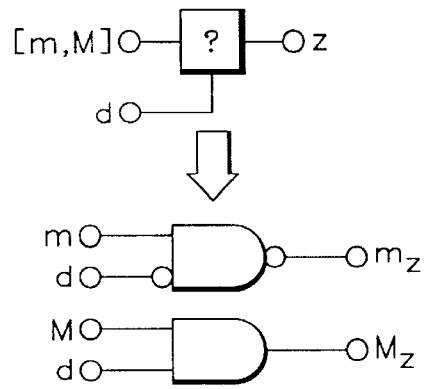
FIG.7A   FIG.7B
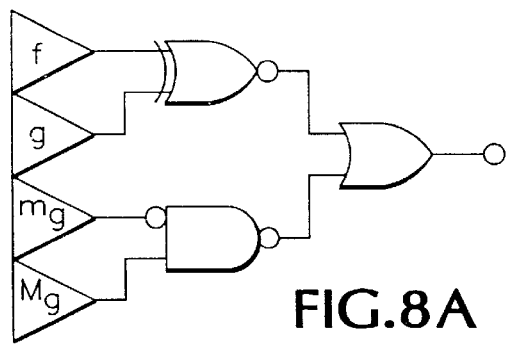
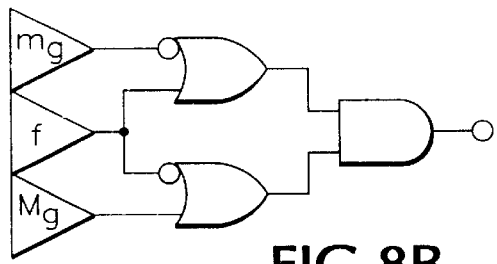
FIG.8A   FIG.8B
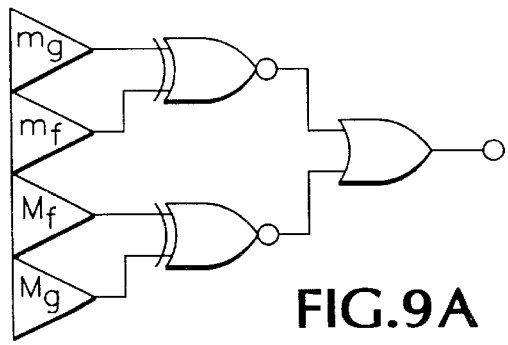
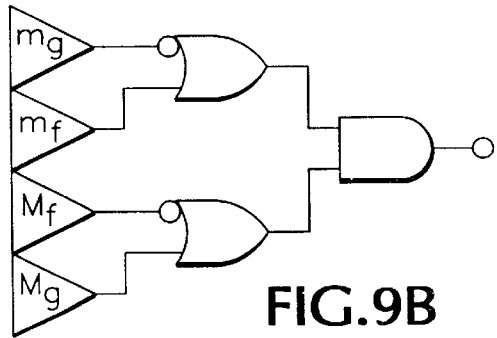
FIG.9A   FIG.9B

CIRCUIT SYNTHESIS VERIFICATION METHOD AND APPARATUS

CROSS-REFERENCE TO RELATED APPLICATIONS

This application is a continuation of U.S. patent application Ser. No. 08/943,419, filed Oct. 3, 1997, issuing as U.S. Pat. No. 6,056,784 on May 2, 2000, which claims priority from U.S. Provisional Patent Application Ser. No. 60/027,766, filed Oct. 4, 1996, both of which are hereby incorporated by reference.

TECHNICAL FIELD

The present invention relates generally to circuit synthesis verification whereby an implementation based upon a system specification is proven before, for example, an integrated circuit is fabricated. More particularly, it concerns improved method and apparatus for verifying circuits having as part of their specification one or more explicit don't care conditions or functions.

BACKGROUND ART

As the complexity of integrated circuits approaches and exceeds one million transistors, the use of event-driven simulation becomes less and less feasible as a method for validating the timing and functionality of a design. Consequently, designers are developing new methodologies around new tools to replace event-driven simulation whenever possible. They are using cycle-based simulators and emulation at the front end of the design process to ensure that the original register-transfer level (RTL) specification meets their expectations.

Static timing verifiers ensure that the design's gate-level implementation meets all of its timing requirements at the back end. Formal verification is useful at both ends of the design process. At the front end, it ensures that a refinement of an RTL description is equivalent to the original specification. At the back end, it verifies that the final gate-level description is a valid implementation of the original or modified specification. While these new tools cannot entirely replace event-driven simulation, they can significantly reduce the amount of simulation required for each design. Since designers may use formal verification at many points in the design flow, what is meant by verification may change as the context changes.

Known background publications include the following references, familiarity with which is assumed, which references are incorporated herein by this reference.

[1] D. Brand, "Verification of Large Synthesized Designs," Proc. 1993 IEEE Intl. Conf. on CAD, November 1993, pp. 534–7;

[2] D. Brand, R. A. Bergamaschi, and L. Stok, "Be Careful with Don't Cares," Proc. 1995 IEEE Intl. Conf. on CAD, November 1995, pp. 83–6;

[3] F. M. Brown, *Boolean Reasoning*, Kluwer Academic Publishers, Boston, 1990;

[4] R. E. Bryant, "Graph-based Algorithms for Boolean Function Manipulation," IEEE Trans. Computers., vol. 35, no. 8, August 1986, pp. 677–91;

[5] R. E. Bryant, "On the Complexity of VLSI Implementations and Graph Representations of Boolean Functions with Application to Integer Multiplication," IEEE Trans. Computers., vol. 40, no. 2, February 1991, pp. 205–13;

[6] E. Cerny, "An Approach to a Unified Methodology of Combinational Switching Circuits," IEEE Trans. Computers., vol. 26, no. 8, August 1977, pp. 745–56;

[7] J. Jain, R. Mukherjee, and M. Fujita, "Advanced Verification Techniques Based on Learning," Proc. 32nd ACM/IEEE DAC, June 1995, pp. 420–6;

[8] W. Kunz, "HANNIBAL: An Efficient Tool for Logic Verification Based on Recursive Learning," Proc. 1993 IEEE Intl. Conf. on CAD, November 1993, pp. 538–43;

[9] Y. Matsunaga, "An Efficient Equivalence Checker for Combinational Circuits," Proc. 33rd ACM/IEEE DAC, June 1996, pp. 629–34; and

[10] D. Stoffel and W. Kunz, "Logic Equivalence Checking by Optimization Techniques," Proc. Intl. Workshop on CAD, Test and Evaluation for Dependability, July 1996, pp. 85–90.

These background references may be referred to herein by first listed author or by their bracketed number, e.g. the Stoffel et al. article is referred to herein simply as [10].

Bryant made the first major breakthrough in formal verification with the development of ordered binary decision diagrams (OBDDs) [4]. OBDDs are canonical directed graph structures for representing logic functions. They allow us to compare logic functions by comparing their OBDDs. In practice, using OBDDs as a canonical form works well for a large number of functions. There are, however, large classes of important circuits for which the size of the digraph grows exponentially. The most famous of these circuits are multipliers [5].

Most of the recent research in verification has concentrated on verifying circuits which have a reasonable amount of structural similarity. This is usually true of synthesized circuits. These methods try to find points in one circuit which can replace points in the other circuit. The techniques used by these systems include automatic test pattern generation (ATPG) [1], recursive learning [8, 10], and other OBDD-based techniques [7, 9]. All of these techniques either implicitly or explicitly use a structure called a miter during verification. Two versions of miters are shown in FIGS. 1A and 1B. In the left-hand circuit of FIG. 1A, a copy of the specification and a copy of the implementation share common inputs. Their outputs are joined using an exclusive-NOR (XNOR) gate. The specification and the implementation are equivalent if and only if the output of the miter is a tautology, i.e., if the circuit can be reduced to a constant 1.

Notice that there is no don't care information represented in this circuit. If there were a function d, which represented a set of input conditions for which designers did not care about the values of the output, then they could modify the miter by connecting a network representing d to the output of the XNOR with an OR gate. This is shown in FIG. 1B.

Circuit designers can introduce don't cares into a network in essentially two ways [2]. First, they can assign an X to a signal in their high-level design language (HDL) source code. While language designers originally intended the X value to represent an unknown value to a simulator, many synthesis systems interpret it as a don't care. Second, they can assert that an input pattern can never occur. For example, if a module implements the next state logic of a one-hot encoded FSM, they could assert that exactly one state bit should be one at all times. One can represent both of these types of don't cares schematically using a don't care cell. This cell has two inputs representing an ordered pair (f, d). The output of the cell evaluates to f when d=0. The output evaluates to X when d=1. FIGS. 2A and 2B show two uses of the don't care cell. The circuit on the left (FIG. 2A) can be used to generate a logical X value. Since the d function is always 1, the output is always X. The right-hand circuit (FIG. 2B) specifies a function z=a·b, which has a don't care set of $d_z=a \oplus b$. This is equivalent to asserting that a and b must be equal.

Using a don't care cell to represent incompletely specified functions, designers can represent don't care information anywhere in a circuit. This would present a problem if they wanted to construct a miter like the one in FIGS. 1A and 1B, because there is no obvious way to construct the don't care network for the primary outputs.

The specification is organized as follows. In the background section above, some of the issues involved in verification when don't cares are present in designs are identified. Specifically, the need for propagating don't care information from internal lines to outputs is demonstrated. In the detailed description to follow, previous formulations for propagating don't cares through a network will be described. Next, the invented method for representing the propagation of don't care conditions with a linear space network will be described by reference to FIGS. 3A through 9B. Finally, the issue of designs having explicit don't care information is addressed. We also show how to use the invented network formulations in several verification contexts. As will be seen, a tremendous advantage of the invented formulation is that it allows existing verification algorithms to work without modification.

DISCLOSURE OF THE INVENTION

The present invention disclosure is not concerned with different methods for performing formal verification. It is concerned with the implications of performing verification in different contexts. Particularly, it is desired to investigate what happens when one compares designs which contain explicit don't care information on internal lines. In the past, synthesis system designers have ignored the issue of don't care conditions during verification based on the following assumptions. First, there was an assumption that only one circuit—typically the specification—had any explicit don't care information associated with it. Second, the designer could succinctly represent this information with a separate network which represented all input conditions for which the outputs of the circuit could take on any value. Third, there was the assumption that the designer could verify hierarchical blocks in isolation, i.e., the hierarchies of the two designs matched and no optimization occurred across blocks. Therefore, there was no need to propagate don't care information from one level of a hierarchy to another.

In practice, however, designers cannot make any of these assumptions. When a designer compares two RTL descriptions at the beginning of the design process, both are likely to contain (possibly different) don't care conditions. Also, a common way to specify don't care information in HDL is to assign a signal the value X. In effect, this allows the designer to specify don't care information at internal points of the circuit. Finally, when comparing pre- and post-layout netlists or an RTL to a gate-level netlist, levels of hierarchy are often different. When parts of a design are flattened to make the hierarchies match, don't care information will again appear at internal lines of the circuit. As will be seen, handling don't cares under these more realistic conditions is not a trivial matter.

Briefly, the invention may be described as follows. The invented method is for verifying a simulated system's compliance with a defined system specification, wherein the system specification has explicitly defined don't care conditions. Preferably, the method includes 1) for each incompletely specified function represented by an ordered pair (f, d) wherein f is an on-set and wherein d is a don't care set, transforming the ordered pair representation into an interval represented by an ordered pair [m, M] wherein [m, M]={f, $m \subseteq f \subseteq M$}; 2) propagating a set of input conditions through such interval to produce a set of output conditions representative of such on-set and of such don't care set; and 3) verifying that the set of output conditions meets the defined system specification.

Another way of describing the invented method is as a method for simulating a system containing explicit don't care functions. Such invented method preferably includes 1) constructing a gate-level implementation of the system including logic gates and don't care functions represented by cells including at least one cell representing an incompletely specified function; 2) transforming each cell that represents an incompletely specified function characterized by an interval having upper and lower bounds into a plurality of cells that implements the upper and lower bounds of the interval of the incompletely specified function; and 3) tautology-checking the plurality of cells for equality or consistency.

The invented apparatus, quite simply, includes operatively coupled processors, e.g. software processes or code, that cooperate to implement the invented method described briefly above.

These and additional objects and advantages of the present invention will be more readily understood after consideration of the drawings and the detailed description of the preferred embodiment which follows.

BRIEF DESCRIPTION OF THE DRAWINGS

FIGS. 7A and 7B schematically illustrate propagating intervals through gates, with FIG. 7A showing a simple case in which there is no explicit don't care and with FIG. 7B showing a more complex case in which there is an explicit don't care.

FIGS. 8A and 8B illustrate a schematic contrast between a traditional miter and an interval miter.

FIGS. 9A and 9B illustrate the construction of interval miters for equality and consistency in accordance with the preferred method and apparatus of the invention.

DETAILED DESCRIPTION OF THE PREFERRED EMBODIMENT AND BEST MODE OF CARRYING OUT THE INVENTION

Figure 3A:
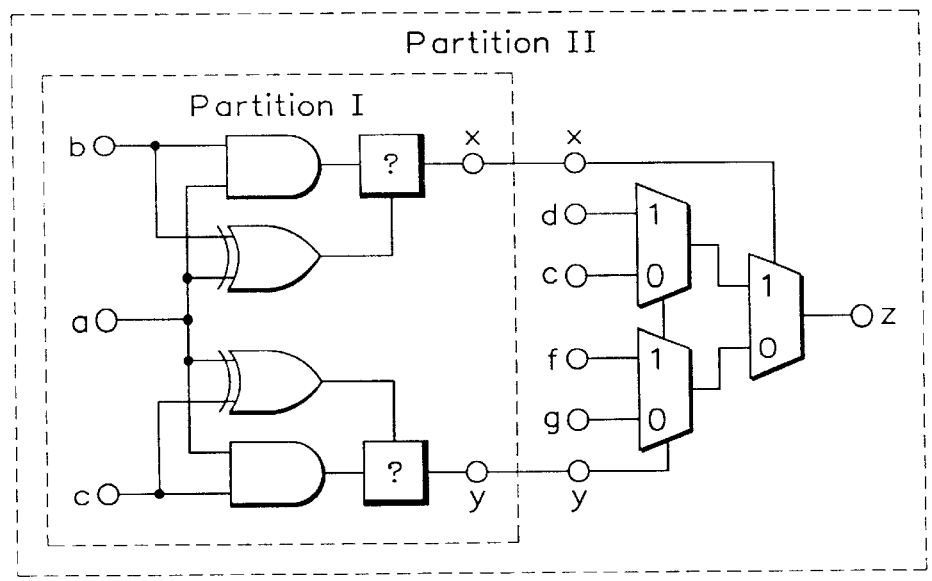
FIGS. 3A and 3B are schematic illustrations of a circuit requiring propagation of don't cares for verification, with FIG. 3A showing the original specification and with FIG. 3B showing a possible implementation.
Figures 3B, 4:
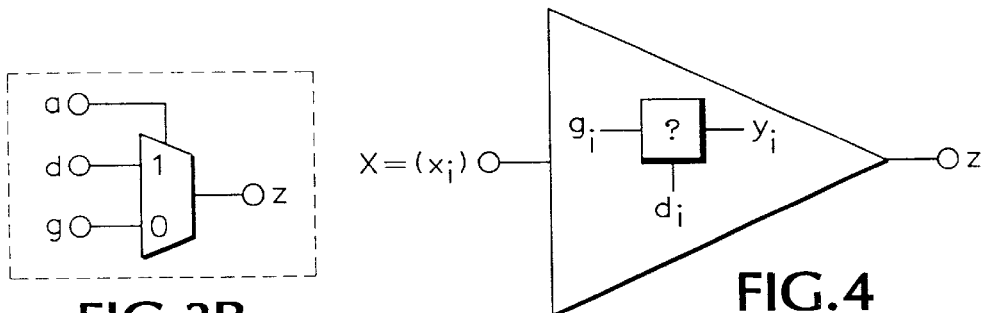
FIG. 4 is a schematic diagram of a circuit having multiple internal don't cares.

The circuits in FIGS. 3A and 3B show why consideration of explicit don't care functions is important in the case of hierarchy. Referring first to FIG. 3A, if a synthesis tool optimizes the subcircuit in Partition I of the specification first, it may find that both output ports x and y can be implemented with direct connections to input a. If the tool flattens the resulting circuit and optimizes again, then a possible implementation is the circuit containing a single multiplexor shown in FIG. 3B. Notice that the levels of hierarchy in the specification and implementation no longer match. An attempt to verify these circuits must flatten the specification. Also, it is not possible to show the equivalence of these circuits without considering the don't care information from Partition I. Specifically, one must propagate the don't care information on ports x and y to port z. In general, it is desirable to devise a method for propagating the don't care information from any point in a circuit to any other point in its transitive fanout.

First, it is helpful to generalize the problem of propagating don't cares through a network and give previous formulations of its solution. FIG. 4 gives a general schematic of a circuit which has multiple internal don't cares. The output line z=f(X) implements a function of the variables in the set $X=\{x_1, \ldots, x_n\}$. Also, there is a set of internal lines in the network $Y=\{y_1, \ldots, y_k\}$, which implement the set of functions $\{g_i\}$ with don't care sets $\{d_i\}$. Of course, the function f(X) is also an incompletely specified function. The problem is to determine its don't care set $d_z$.

If A is a subset of the lines in a circuit, then it may be stated that $f^A$ is the function when the circuit is cut at the lines in A, i.e., the lines in A become additional primary inputs. If it is desired to propagate the don't care set at point i to the output, one may compute this as $$\frac{\partial f^{\{y_i\}}}{\partial y_i} \cdot d_i \quad (1).$$

This represents the input patterns for which $f^{\{y_i\}}$ is dependent on the value of $y_i$ but for which one does not care about the value of $g_i$. All of these conditions can be propagated by using the following expression:

$$\sum_{i=1}^{k} \frac{\partial f^{\{y_i\}}}{\partial y_i} \cdot d_i \quad (2).$$

Unfortunately, this intuitive formula does not permit verification of the circuits in FIGS. 3A and 3B, so there must be don't care conditions that it does not capture.

One can characterize all don't cares of a circuit as follows using a formulation attributable to Cerny [6]. First, one starts with a relation that describes all possible legal assignments to X, Y and z:

$$\Phi(X, Y, z) = (z \otimes f^Y) \cdot \prod_{i=1}^{k} (y_i \otimes g_i + d_i) \quad (3).$$

Next, one reduces this to an expression which describes all legal input and output combinations between X and z:

$$\exists Y, \Phi(X, Y, z) \quad (4).$$

One interprets the existential quantifier as $\exists y, f=f_y+f_{\bar{y}}$. The don't care set of f is the set of input combinations for which the relation allows z to take any value:

$$d_z = \cup_z, \exists Y, \Phi(X, Y, z) \quad (5).$$

One interprets the universal quantifier as $\cup z, f=f_z \cdot f_{\bar{z}}$. Another way of expressing Eq. (5) is as follows.

Theorem One: Given a circuit as in FIG. 4, the external don't care set of line z is $$d_z = \sum_{A \in 2^Y} \left( \frac{\partial^{|A|} f^A}{\partial A} \cdot \prod_{y_i \in A} d_i \right) \text{ where } \partial A \equiv \prod_{a_1 \in A} \partial a_1 \quad (6).$$

Note: The proof is by induction on k. It is straightforward to verify that the expression of Eq. (2) is simply the first order terms from the right-hand side of Eq. (6).

Figure 5:
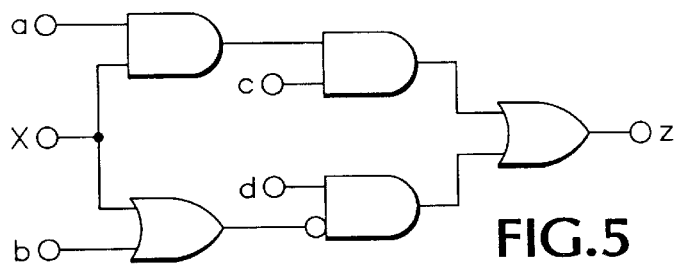
FIG. 5 schematically illustrates why one must be careful with the logic X value.

One must be careful, however, when using this formulation because it assumes that each incompletely specified function $g_i$ will be replaced by a single fully specified function $g'_i$. This is always the case if each $y_i$ has only one fanout, and it is normally the case when $g_i$ is a non-trivial function. However, if a net is driven by a logic X, then problems can arise. For example, if one performs an exhaustive simulation on the circuit in FIG. 5, then it may be determined that the only values that appear on the output are 0 and X. One might conclude that this network could be implemented as a constant 0.

Synthesis can reach this result by replacing each branch fed by the logic X in the specification with an appropriate constant. However, if one replaces the X with a single don't care network and uses Eq. (6), then a don't care set of $ac\oplus \bar{b}d$ is obtained. This is not sufficient to verify the synthesis result against the original circuit. If one wants to take advantage of the fact that synthesis can replace each branch with a different function, then the full don't care set should be $ac+\bar{b}d$. One can find this using Eq. (6) if one cuts the circuit on the fanout branches rather than at the fanout stems of the don't care cells in the specification. This has the effect of increasing the number of variables in the expression before quantification.

Besides the need to add extra variables, there is one other drawback to this formulation. While there are straightforward methods for computing Eq. (6) using OBDDs, the circuit structure corresponding to it requires $O(2^k)$ copies of the specification. As long as the OBDDs for the circuits and the don't care sets are small, there is not a problem. However, if other methods are used that require the construction of a miter and, therefore, a network representation of the don't care set, then one must find a different representation that has a reasonable size and is easy to create. Thus, it will be shown how to create a don't care network which is linear in the size of the original network, the construction of which is a simple linear time operation.

To this point, an ordered pair (f, d) has been used to represent an incompletely specified function where f is referred to as the on-set and d is referred to as the DC-set. (These functions form the two inputs to a don't care cell.) This pair will be understood to be the set of functions (f, d)={f', (d=0)→(f'=f)}. Another way to represent incompletely specified functions is with an interval [3]. An interval is also a pair of functions denoted [m, M]. One can interpret an interval as the set of functions [m, M]={f, m⊆f⊆M}. The following proposition relates these two forms.

Proposition One: The incompletely specified function represented by the pair (f,d) is equivalent to the interval [f·$\bar{d}$, f+d]. Also, the interval [m, M] is equivalent to the pair (f, M·$\bar{m}$) where f∈[m, M].

Proposition One instructs that, for each incompletely specified function represented by an on-set and DC-set, there is also a unique interval representation. Also, for each interval there is an equivalent ordered pair with a unique DC-set. This pair may not have a unique on-set, however, since any fully specified function which is a member of the interval may serve as the on-set. Accordingly, an interval is a more precise representation of an incompletely specified function since each one has a single interval representation. This precision permits the creation of a don't care network from a flattened hierarchy very easily. (Those of skill will appreciate that a completely specified function f is the same as the interval [f,f] or the ordered pair (f, 0)).

Below, it will be shown how to transform a circuit like that in FIG. 4 into a circuit with two outputs, $m_z$ and $M_z$. These new outputs are the lower and upper bound of the interval for the incompletely specified function at the output. In order to do this, it is necessary to take each gate g, some of the inputs of which are incompletely specified functions, and to create two new gates $m_g$ and $M_g$, which represent the interval for the function at the output of g. The following Proposition Two shows how to do this for a NAND gate. Since the NAND function is a complete function for switching algebras, one can make this transformation for any arbitrary logic gate.

Proposition Two: Suppose incompletely specified functions $[m_f, M_f]$ and $[m_g, M_g]$ are inputs of a NAND gate. Then the incompletely specified function at the output is $[\overline{M_f \cdot M_g}, \overline{m_f \cdot m_g}]$.

Figures 6A, 6B:
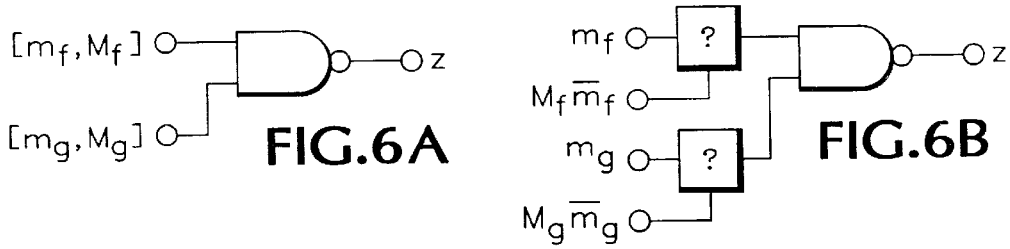
FIGS. 6A and 6B schematically illustrate equivalent incompletely specified NAND cells.

Note: By Proposition One, the circuits in FIGS. 6A and 6B are equivalent. Using Eq. (5), the don't care set of the right-hand circuit (FIG. 6B) is $$\forall_z, \exists xy, (x \oplus m_f + M_f \overline{m_f})(y \oplus m_g + M_g \overline{m_g})\ (z \oplus \overline{xy}) = M_f M_g \overline{m_f m_g} \quad (7).$$

Consequently, the incompletely specified function at z is the pair $(\overline{m_f m_g}, M_f M_g \overline{m_f m_g})$, or, in interval form, $[\overline{M_f M_g}, \overline{m_f m_g}]$.

In other words, the function at the output of a single NAND gate with incompletely specified functions on its inputs can be represented in interval form by two completely specified NAND gates. In fact, the output function of any primitive gate which consists of an AND gate with inversions allowed an any input as well as the output may be represented by two copies of the same gate. If the gate is an XOR or XNOR, this is not true, but one may represent the XOR or XNOR with equivalent networks of ANDs with inversions and get a similar result. Consequently, there is a strong correlation between the interval network and the original network.

The next simple proposition shows how to create the pair of gates representing the interval at the output of a don't care cell.

Proposition Three: Suppose the incompletely specified function [m, M] is the on-set input of a don't care gate with don't care function d. Then the incompletely specified function at the output is $[m \cdot \overline{d}, M+d]$.

Note: Proposition Three is a generalization of Proposition One. The proof of Proposition Three is similar to that of Proposition Two. (It will be appreciated by those of skill in the art that if the don't care input to a don't care cell is an incompletely specified function, then one may safely replace it with the upper bound of the interval.)

FIGS. 7A and 7B illustrate these transformations more specifically. If a circuit consists of primitive logic gates (i.e. NAND, NOR, XOR, etc.) and DC cells, then each cell in the original circuit that implements an incompletely specified function can be transformed into a set of cells that implements the upper and lower bound of the interval of the function. The number of new cells created for each original cell is bounded by a small constant. This constant typically is two for most primitive cells but as noted above, it is six for XOR and XNOR gates. The following theorem immediately follows.

Theorem Two: Given a circuit as in FIG. 4, which consists of n primitive logic gates and don't care cells, one can construct a circuit which represents the don't care set of the output z with O(n) primitive gates in O(n) time.

Note: It is already seen that each gate in the original network results in a bounded constant c number of gates in the networks representing the interval of z. One can construct the don't care function with one additional gate which computes $M_z \cdot \overline{m_z}$. In a further formulation described below, this additional gate will be dispensed with. Therefore, the don't care network contains at most $O(c \cdot n+1) = O(n)$ gates. One can construct this network in linear time with a post-order depth-first search starting from z.

While discussing FIGS. 3A and 3B above, it was stated that one could not verify the implementation circuit (FIG. 3B) against the specification circuit (FIG. 3A) without considering the don't care information. In this example, the specification was an incompletely specified function while the implementation was a completely specified function. This begs the question of what it means to verify an implementation with a specification when don't cares are present. There are three possible scenarios in which verification can occur.

Figure 1A:
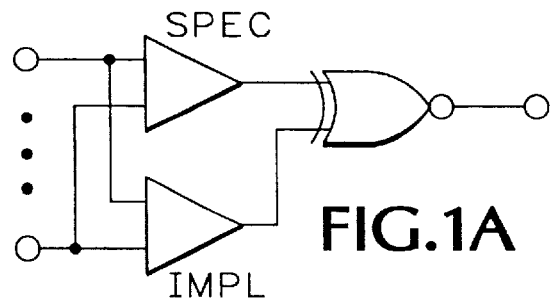
FIGS. 1A and 1B schematically illustrate miters, respectively, with and without don't cares.

Scenario One: One is verifying a completely specified function f against another completely specified function g. It may be said with confidence that verification in this scenario means showing that f and g are exactly equal, i.e., that they always produce the same output for a given input. This is the situation when one compares two gate-level designs. One can verify this property by showing that the function f⊕g is a tautology. This is equivalent to the miter shown in FIG. 1A.

Figure 1B:
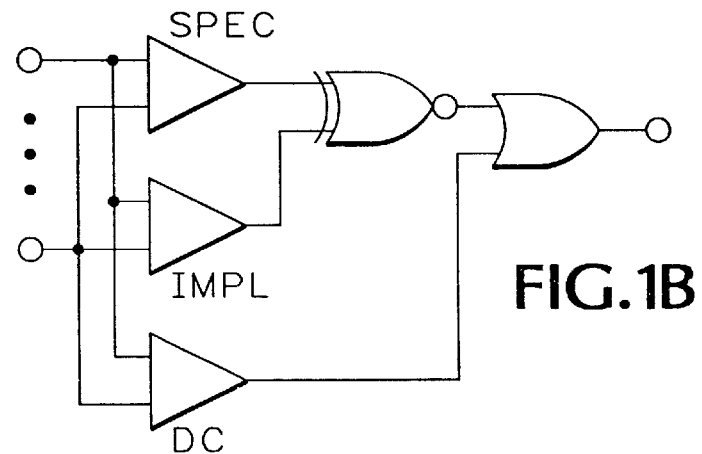
Figure 2A:
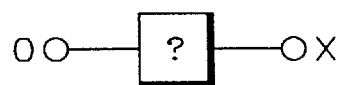
FIGS. 2A and 2B are two different schematic representations of don't care (DC) cells in a network.
Figure 2B:
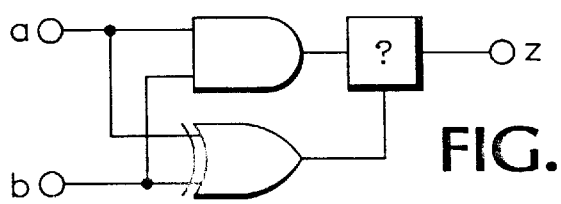

Scenario Two: One is verifying a fully specified implementation f ("Impl" in FIGS. 1A and 1B) against an incompletely specified specification g ("Spec" in FIGS. 1A and 1B). Verification in this scenario commonly means showing that f is a possible implementation of g, i.e., that they produce the same output when $d_g=0$. This scenario occurs when one compares a gate-level design to an RTL design. One can verify this property by showing that the function f⊕+$d_g$ is a tautology. This formulation is equivalent to the miter of FIG. 1B, in which the don't care function ("DC") is ORd into the output. An equivalent formulation is to show that f∈$[m_g, M_g]$, i.e., $m_g \subseteq f \subseteq M_g$, or that $\overline{m_g} \cdot f + \overline{f} \cdot M_g$ is a tautology. This is a superior formulation in the sense that the number of gates in this circuit is smaller than that of the original miter of FIG. 1A. This is because the original miter contains a copy of the implementation, the specification and the interval circuits. Importantly, the new formulation contains a copy only of the implementation and the interval circuits. This is illustrated in FIGS. 8A and 8B. Finally, it will be appreciated that Scenario Two subsumes Scenario One.

Scenario Three: The most interesting case is when one is verifying an incompletely specified function f against another incompletely specified function g. This situation will often arise when one tries to verify two RTL descriptions against one another. This scenario is the most interesting because it subsumes the previous two. In addition, there are at least three possible interpretations of verification for this scenario.

In the first interpretation, one must know if the two functions are exactly the same, i.e. one must know whether the sets of all compatible fully specified functions are the same for both functions. This property is referred to as equality. One can formalize this property as proving $[m_f, M_f]=[m_g, M_g]$ or $m_f=m_g \wedge M_f=M_g$. The equivalent circuit is $(m_f \oplus m_g) \cdot (M_f \oplus M_g)$. If this circuit is a tautology, then the circuits are equivalent. The equality property subsumes Scenario One because $m_f=M_f$ and $m_g=M_g$ for fully specified functions.

In the second interpretation, one need know only if one design is a refinement of the other, i.e. whether all compatible fully specified functions of the implementation are a subset of all compatible functions of the specification. This property is referred to as consistency. One can prove that f is consistent with g by showing that $[m_f, M_f] \subseteq [m_g, M_g]$ or $(m_g \subseteq m_f)^\wedge(M_f \subseteq M_g)$. The equivalent circuit to use for tautology-checking is $(\overline{m}_g + m_f) \cdot (\overline{M}_f + M_g)$. The consistency property subsumes both Scenarios One and Two. (If f is consistent with g, and g is consistent with f, then f is equal to g.)

In the final interpretation, one asks if there is at least one fully specified function compatible with both incompletely specified functions. One says that functions with this property are not inconsistent. It may be shown that f and g are not inconsistent by showing that $[m_f, M_f] \cap [m_g, M_g] \neq \emptyset$ or $\neg (M_f \subseteq m_g \vee M_g \subseteq m_f)$. While this may be a valid interpretation for verification, it is not preferred as it is believed to lead to inconclusive verification results.

Importantly, one can formulate all three interpretations in terms of relations on the intervals of the two functions. Consequently, one needs not build an explicit network for the don't care sets of the functions. One needs only build networks for the endpoints of the intervals, and, rather than construct traditional miters, connect the outputs of the interval circuits with the logic appropriate for the property one wishes to verify. FIGS. 9A and 9B show the appropriate circuits, constructed in accordance with the preferred embodiment of the invention, for equality and consistency. This provides a uniform method of construction as well as reducing the number of gates in the resulting circuit. It also permits the application of existing verification algorithms, which were designed to work on miters, to new formulations of the verification problem. This is because any structural similarity is retained by the interval networks.

In summary, the invention addresses the issue of the formal verification of incompletely specified hierarchical circuits. First, the need for the propagation of don't care information from one point of a network another was demonstrated. Next, it was shown how to perform this propagation by constructing a don't care network that propagates the effects of an incompletely specified sub-function in a circuit to points in its transitive fanout. This was shown by converting the ordered pair representation of an incompletely specified function into an interval representation. Finally, several formulations of the verification problem in the presence of the incompletely specified functions were described and illustrated. The interval-based representation greatly facilitates the creation of circuits which permit the testing of each of these formulations while using existing verification algorithms.

The invented apparatus may be understood without illustration very simply to include operatively coupled first, second and third processors that cooperate to implement the preferred method described in detail above and illustrated herein. Those of skill in the art will appreciate that, although preferably the processors are software processor imbedded in code executed by a general-purpose computer, the processors alternatively and yet within the spirit and scope of the invention may be hardware- or firmware-assisted or implemented.

Accordingly, while the present invention has been shown and described with reference to the foregoing preferred method and apparatus, it will be apparent to those skilled in the art that other changes in form and detail may be made therein without departing from the spirit and scope of the invention as defined in the appended claims.

I claim:
1. A computer program product comprising:
   a computer usable medium having a computer readable program code embodied therein for causing a computer to verify a simulated system's compliance with a defined system specification, wherein the system specification has explicitly defined don't care conditions, the computer readable program code comprising:
   code that, for each incompletely specified function represented by an ordered pair (f,d) wherein f is an on-set and wherein d is a don't care set, transforms the ordered pair representation into an interval represented by an ordered pair [m, M] wherein $[m, M]=\{f, m \subseteq f \subseteq M\}$;
   code that propagates a set of input conditions through such interval to produce a set of output conditions representative of such on-set and of such don't care set; and code that verifies that the set of output conditions meets the defined system specification.

2. The computer program product of claim 1, wherein the code that transforms includes code that implements an upper and a lower bound of the interval.

3. The computer program product of claim 1, wherein the code that transforms includes code that represents each cell in the system specification that implements an incompletely specified function as a plurality of cells that implements the upper and lower bound of the interval of a function defined by such cell in the system specification.

4. The computer program product of claim 1 in which the system specification includes a plurality of primitive cells, wherein the code that transforms includes code that replaces each such primitive cell in the system specification that implements an incompletely specified function by a multiplicity of new cells that implement the upper and lower bound of the interval of a function defined by such cell in the system specification, with the multiple being less than or equal to a relatively small integer constant.

5. The computer program product of claim 4, wherein the integer constant is six.

6. The computer program product of claim 5, wherein the multiple is two for substantially all of such cells and wherein the multiple is six for the remaining ones of such cells.

7. The computer program product of claim 1, wherein functions associated with the code that transforms and the code that propagates are performed automatically by an electronic processor.

8. A software program for simulating a system containing explicit don't care functions, the software program executable by a computer, the software program comprising:
   code for constructing a gate-level implementation of the system including logic gates and don't care functions represented by cells including at least one cell representing an incompletely specified function;
   code for transforming each cell that represents an incompletely specified function characterized by an interval having upper and lower bounds into a plurality of cells that implements the upper and lower bounds of the interval of the incompletely specified function; and
   code for tautology-checking the plurality of cells for equality or consistency.

9. The software program of claim 8, wherein the code for said tautology-checking is for equality.

10. The software program of claim 8, wherein the code for tautology-checking is for consistency.

11. The software program of claim 8, wherein functions associated with the code for transforming and the code for tautology-checking are performed automatically by an electronic processor.

12. The software program of claim 11, wherein the plurality is less than or equal to a relatively small integer constant.

13. The software program of claim 12, wherein the integer constant is six.

14. The software program of claim 13, wherein the plurality is two for substantially all of such cells and wherein the plurality is six for the remaining ones of such cells.

* * * * *